United States Patent

Sato et al.

[11] Patent Number: 5,930,187
[45] Date of Patent: Jul. 27, 1999

[54] ONE-CHIP LSI INCLUDING A GENERAL MEMORY AND A LOGIC

[75] Inventors: Katsuhiko Sato; Shinji Miyano, both of Yokohama, Japan

[73] Assignee: Kabushiki Kaisha Toshiba, Tokyo, Japan

[21] Appl. No.: 08/962,358

[22] Filed: Oct. 31, 1997

[30] Foreign Application Priority Data

Oct. 31, 1996 [JP] Japan ................................... 8-290192

[51] Int. Cl.⁶ ................................................. G11C 7/00
[52] U.S. Cl. ............................ 365/201; 365/51; 365/52; 365/63; 257/203; 257/909
[58] Field of Search .............................. 365/201, 51, 52, 365/63; 257/296, 203, 909

[56] References Cited

U.S. PATENT DOCUMENTS

5,680,355 10/1997 Saruwatari ................................. 365/51
5,698,876 12/1997 Yabe et al. ................................ 257/296

Primary Examiner—Huan Hoang
Attorney, Agent, or Firm—Banner & Witcoff, Ltd.

[57] ABSTRACT

An LSI chip has a main surface occupied by a logic section, a data input/output section and a memory macro section. The memory macro section is a rectangular section arranged on the main surface of the LSI chip. A test control circuit is arranged along one side of the memory macro section. A data input/output circuit is arranged along another side of the memory macro section. The test control circuit may be arranged along one side of the LSI chip. Test data is supplied from the test control circuit to the data input/output circuit through a data bus. As a result, a load of designing a memory logic LSI can be lightened.

26 Claims, 10 Drawing Sheets

ONE-CHIP LSI INCLUDING A GENERAL MEMORY AND A LOGIC

BACKGROUND OF THE INVENTION

The present invention relates to a one-chip LSI (memory-logic LSI) including a general memory and a logic.

In recent years, a one-chip LSI has been developed, which includes a memory for storing data and a logic for processing data. As regards the one-chip LSI, the following matters should be taken into consideration: to maintain high-integration density of a general memory and high-accessibility of a logic in integrating them in one chip; to make a design as easy as in the case of an ASIC (Application Specific Integrated Circuit) for an LSI designer; and to save the manufacturing cost.

Figure 1:
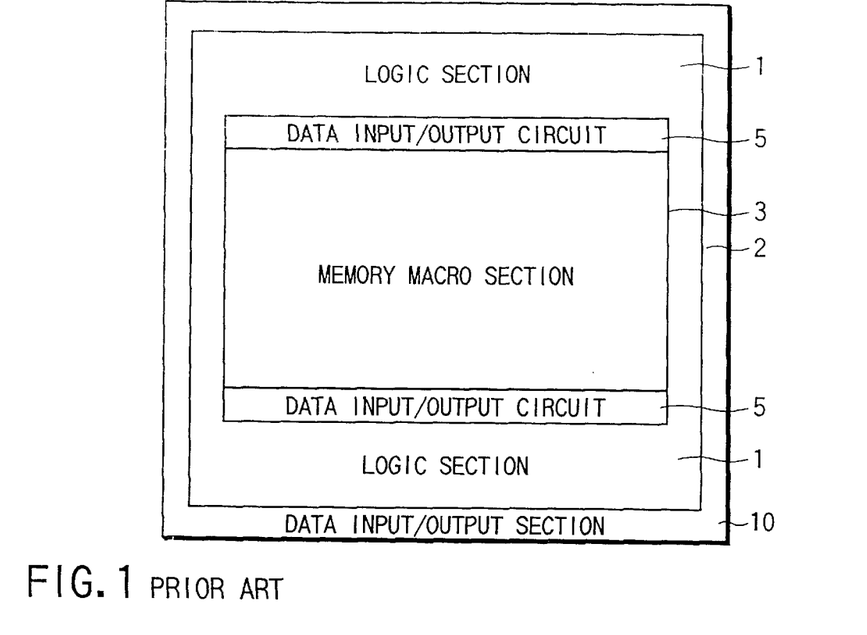
FIG. 1 is a diagram showing a conventional chip layout.

FIG. 1 is a schematic diagram showing a chip layout of a conventional memory-logic LSI.

A logic section 1, a data input/output section 2, and a memory macro section 3 are formed on the main surface of an LSI chip 10.

The memory macro section 3 is arranged in a central portion of the main surface of the LSI chip 10. The layout within the memory macro section 3 is basically the same as that in the conventional general memory which has been developed and produced.

The memory macro section 3 comprises a data input/output circuit 5 for transmitting data between the logic section 1 and the memory macro section 3. The data input/output circuit 5 is arranged along a part of the periphery of the memory macro section 3.

The logic section 1 surrounds the memory macro section 3. The logic section 1 comprises a gate array, a standard cell and a mega-cell. A test control circuit for use in a test of the memory macro section 3 is formed in the logic section 1.

The data input/output section 2, formed along the edges of the LSI chip 10, is used to transmit data between the interior of the LSI chip and an external device. The data input/output section 2 comprises data input/output circuits, data input/output pads and protecting circuits.

The memory-logic LSI as described above is advantageous in that the number of bits which is simultaneously input to and output from the memory macro section 3, i.e., the bit type (×n), can be set to, for example, 8 times or 16 times of the number of bits in the case of a general memory (DRAM), since data transmission between the memory and the logic circuit is performed inside the chip.

According to the aforementioned memory-logic LSI, it is possible to provide a memory macro section 3 of a super-multiple bit type, e.g., 256 bit type or 1 kilobit type. Accordingly, the rate of data transfer between the logic section 1 and the memory macro section 3 can be improved, which allows high-speed data processing.

For this reason, the memory-logic LSI is very much suitable for use in an image processing unit of a PC (Personal Computer) or EWS (Engineering Work Station).

In the memory-logic LSI shown in FIG. 1, the memory macro section 3 is designed by an LSI designer so as to have a memory capacity (e.g., 16 MB) and a bit type (e.g., ×256) to satisfy the user's requirements.

In the case of the layout shown in FIG. 1, when the memory capacity or bit type of the memory macro section 3 is changed, the structure of the logic section 1 must also be changed accordingly. Thus, it takes a considerable period of time to design an LSI.

Further, in the memory-logic LSI shown in FIG. 1, the test control circuit for testing the memory macro section 3 is formed inside the logic section 1. When a test is carried out, an address signal and data are supplied to the memory macro section 3 from an external device outside the LSI chip 10 through the data input/output section 2 and the test control circuit of the logic section 1 (direct access system).

In the case of the layout shown in FIG. 1, if the structure of the logic section 1 is changed, it is necessary to redesign the test control circuit for testing the memory macro section 3, even if the structure of the memory macro section 3 is not changed.

As described above, whenever the logic section 1 is changed, the test control circuit for testing the memory macro section 3 must be changed. Therefore, it is difficult to form the conventional memory-logic LSI as an ASIC which meets a demand for a number of types in small quantities.

BRIEF SUMMARY OF THE INVENTION

The present invention has been made to solve the above problems and its object is to provide a memory-logic LSI as an ASIC, which lightens the load in designing an LSI and achieves reduction of a developing period and standardization of tests.

To achieve the above object, according to an aspect of the present invention, a memory and a logic are formed on a one-chip LSI. The main surface of the one-chip LSI is occupied by a memory macro section in which the memory is arranged, a logic section in which the logic circuit is arranged, and a data input/output section for transmitting data between the interior of the LSI chip and an external device. The memory macro section comprises a data input/output circuit, arranged along a part of the periphery of the memory macro section, for transmitting data between the memory macro section and the logic section, and a test control circuit, arranged along another part of the periphery of the memory macro section, for control of a test of the memory macro section.

According to another aspect of the present invention, memories and a logic are formed on a one-chip LSI. The main surface of the one-chip LSI is occupied by a plurality of memory macro sections in which the memories are arranged, a logic section in which the logic circuit is arranged, and a data input/output section for transmitting data between the interior of the LSI chip and an external device. Each of the memory macro sections comprises a data input/output circuit, arranged along a part of the periphery of the memory macro section, for transmitting data between the memory macro section and the logic section, and a test control circuit, arranged along another part of the periphery of the memory macro section, for control of a test of the memory macro section. The test control circuits of the plurality of memory macro sections have a test data line common to the memory macro sections. Test data is guided to the data input/output circuits of the memory macro sections through the common test data line.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

A memory-logic LSI of the present invention will be described in detail with reference to the accompanying drawings.

Figure 2:
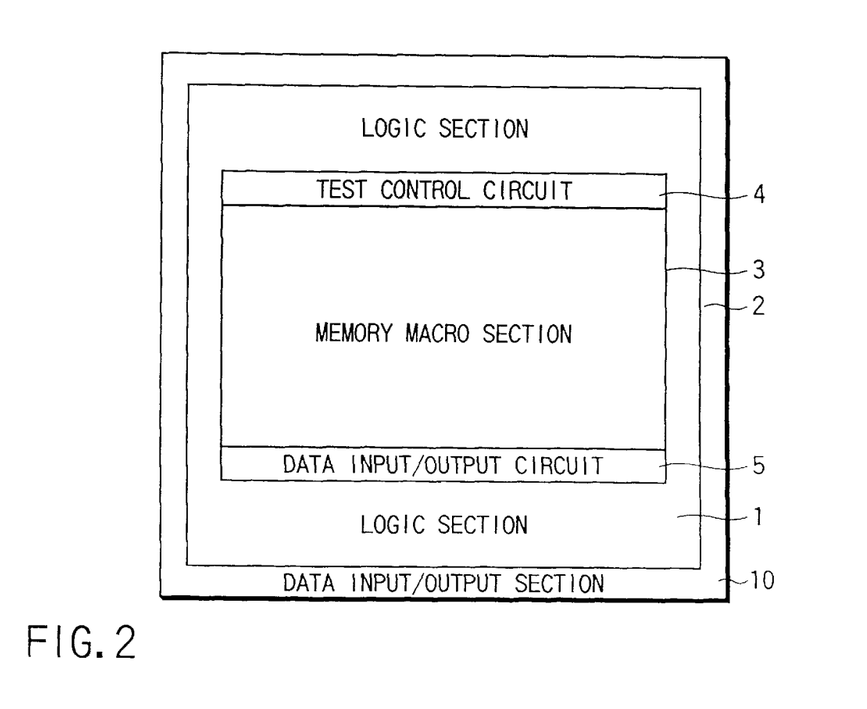
FIG. 2 is a diagram showing a chip layout according to a first embodiment of the present invention.

FIG. 2 shows a chip layout of a memory-logic LSI according to a first embodiment of the present invention.

A logic section 1, a data input/output section 2 and a memory macro section 3 are formed on the main surface of an LSI chip 10.

The memory macro section 3 is arranged in a central portion of the main surface of the LSI chip 10. The memory macro section has a test control circuit 4 and a data input/output circuit 5. The test control circuit 4 is arranged along a part of the periphery of the memory macro section 3, and the data input/output circuit 5 is arranged along another part of the periphery of the memory macro section 3.

For example, if the memory macro section 3 is a rectangular section arranged in the LSI chip 10, the test control circuit 4 is arranged along one side of the memory macro section 3 and the data input/output circuit 5 is arranged along another side of the memory macro section 3 (e.g., the side opposite to that along which the test control circuit 4 is arranged).

The test control circuit 4 is used to test the memory macro section 3 in a test mode. The data input/output circuit 5 is used to transmit data between the logic section 1 and the memory macro section 3 in a normal operation mode.

The logic section 1 surrounds the memory macro section 3. The logic section 1 comprises a gate array, a standard cell and a mega-cell, etc.

The data input/output section 2, arranged along the periphery of the LSI chip 10, is used to transmit data between the interior of the LSI chip and an external device. The data input/output section 2 comprises data input/output circuits, data input/output pads and protecting circuits.

The chip layout of the aforementioned memory-logic LSI is featured in that the test control circuit 4 is arranged within the memory macro section 3. In other words, the memory macro section 3 including the test control circuit 4 is formed as a module, and the test control circuit 4 is completely separated from the logic section 1.

Since the layout of the test control circuit 4 is not influenced by the layout of the logic section 1, even if the structure of the logic section 1 is changed, it is unnecessary to redesign the test control circuit 4.

Figure 3:
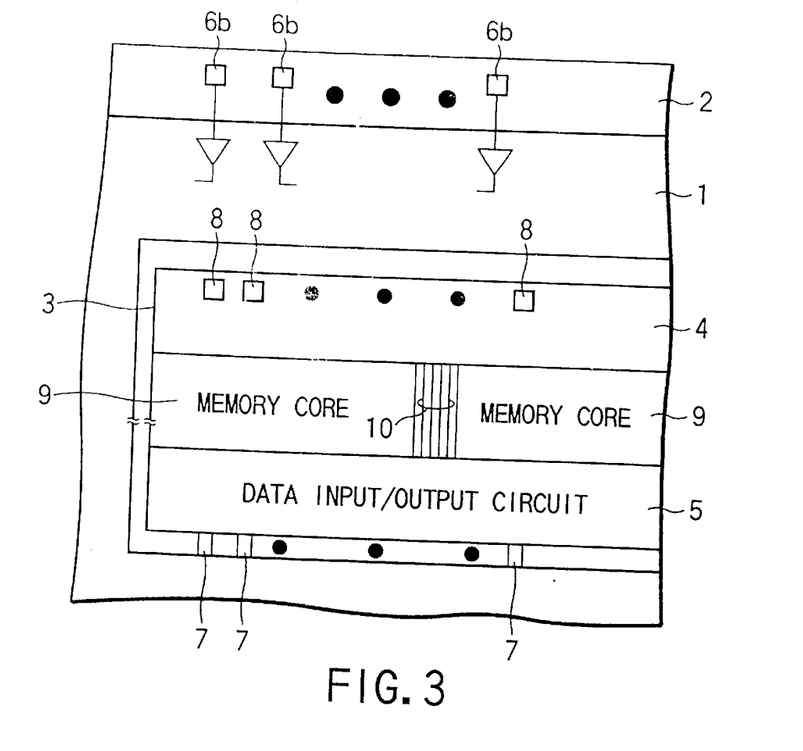
FIG. 3 is a diagram showing details of the chip layout shown in FIG. 2.
Figure 4:
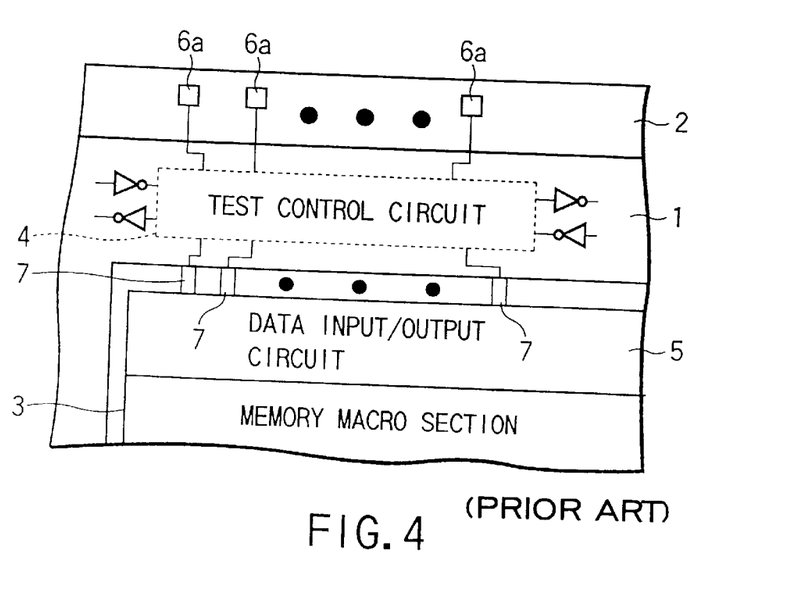
FIG. 4 is a diagram showing details of the chip layout shown in FIG. 1.

FIG. 3 shows details of the layout of the memory-logic LSI shown in FIG. 2, and FIG. 4 shows details of the layout of the conventional memory-logic LSI shown in FIG. 1.

In the layout of FIG. 4, the test control circuit 4 is arranged within the logic section 1. Therefore, if the layout of the logic section 1 is changed, it is necessary to change the layout of the test control circuit 4 also.

In contrast, in the layout of FIG. 3, the test control circuit 4 is arranged within the memory macro section 3 formed as a module. Therefore, the layout of the test control circuit 4 can be determined independent of the layout of the logic section 1. Test data is applied to a data input/output pad 8 in the test control circuit 4 and guided to the data input/output circuit 5 through a data bus 10.

In FIGS. 3 and 4, the data input/output pads 8 and 6a are used in both the test mode and the normal operation mode. Data input/output terminal patterns 7 connect the logic section 1 and the data input/output circuit 5 of the memory macro section 3 formed as a module.

Thus, according to the memory-logic LSI, the memory macro section 3 including the test control circuit 4 is formed as a module, it is unnecessary to redesign the test control circuit 4 even if the logic section 1 is changed.

Accordingly, the load of the LSI designer is lightened, and the LSI of the present invention, formed as an ASIC, achieves reduction of a developing period and standardization of tests.

Figure 5:
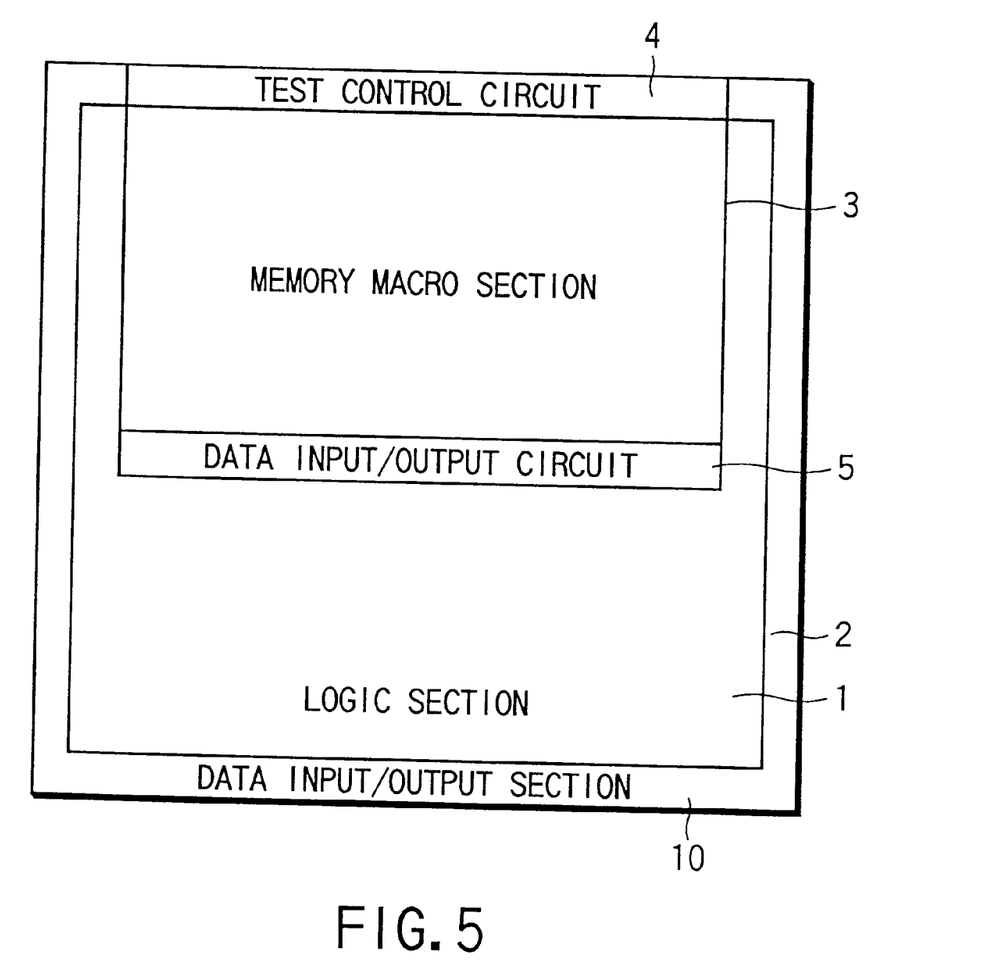
FIG. 5 is a diagram showing a chip layout according to a second embodiment of the present invention.

FIG. 5 shows a chip layout according to a second embodiment of the present invention.

The LSI of this embodiment is different in chip layout from the LSI shown in FIG. 2 in that a test control circuit 4 is formed along one side of an LSI chip 10.

A logic section 1, a data input/output section 2, and a memory macro section 3 are formed along the main surface of the LSI chip 10.

The memory macro section 3 is adjacent to one side of the LSI chip 10 on the main surface thereof. The memory macro section 3 comprises a test control circuit 4 and a data input/output circuit 5. The test control circuit 4 is arranged along a part of the periphery of the memory macro section 3, which coincides with a part of the aforementioned side of the LSI chip 10. The data input/output circuit 5 is arranged along another part of the periphery of the memory macro section 3.

For example, if the memory macro section 3 is a rectangular section arranged on the LSI chip 10, the test control circuit 4 is arranged on one side of the memory macro section 3 (which coincides with one side of the LSI chip 10) and the data input/output circuit 5 is arranged along another side of the memory macro section 3 (e.g., the side opposite to that along which the test control circuit 4 is arranged).

The test control circuit 4 is used to test the memory macro section 3 in a test mode. The data input/output circuit 5 is used to transmit data between the logic section 1 and the memory macro section 3 in a normal operation mode.

The logic section 1 surrounds three sides of the memory macro section 3, except the side along which the test control circuit 4 is arranged. The logic section 1 comprises a gate array, a standard cell and a mega-cell, etc.

The data input/output section 2 is arranged along the three sides of the LSI chip 10, except the side along which the test control circuit 4 is arranged. The section 2 is used to transmit data between the interior of the LSI chip and an external device, and comprises data input/output circuits, data input/output pads and protecting circuits.

The chip layout of the aforementioned memory-logic LSI is featured in that the test control circuit 4 is arranged within the memory macro section 3 formed as a module. In other words, since the layout of the test control circuit 4 is not influenced by the layout of the logic section 1, even if the structure of the logic section 1 is changed, it is unnecessary to redesign the test control circuit 4.

Accordingly, the load of the LSI designer is lightened, and the LSI of the present invention, formed as an ASIC, achieves reduction of a developing period and standardization of tests.

Figure 6:
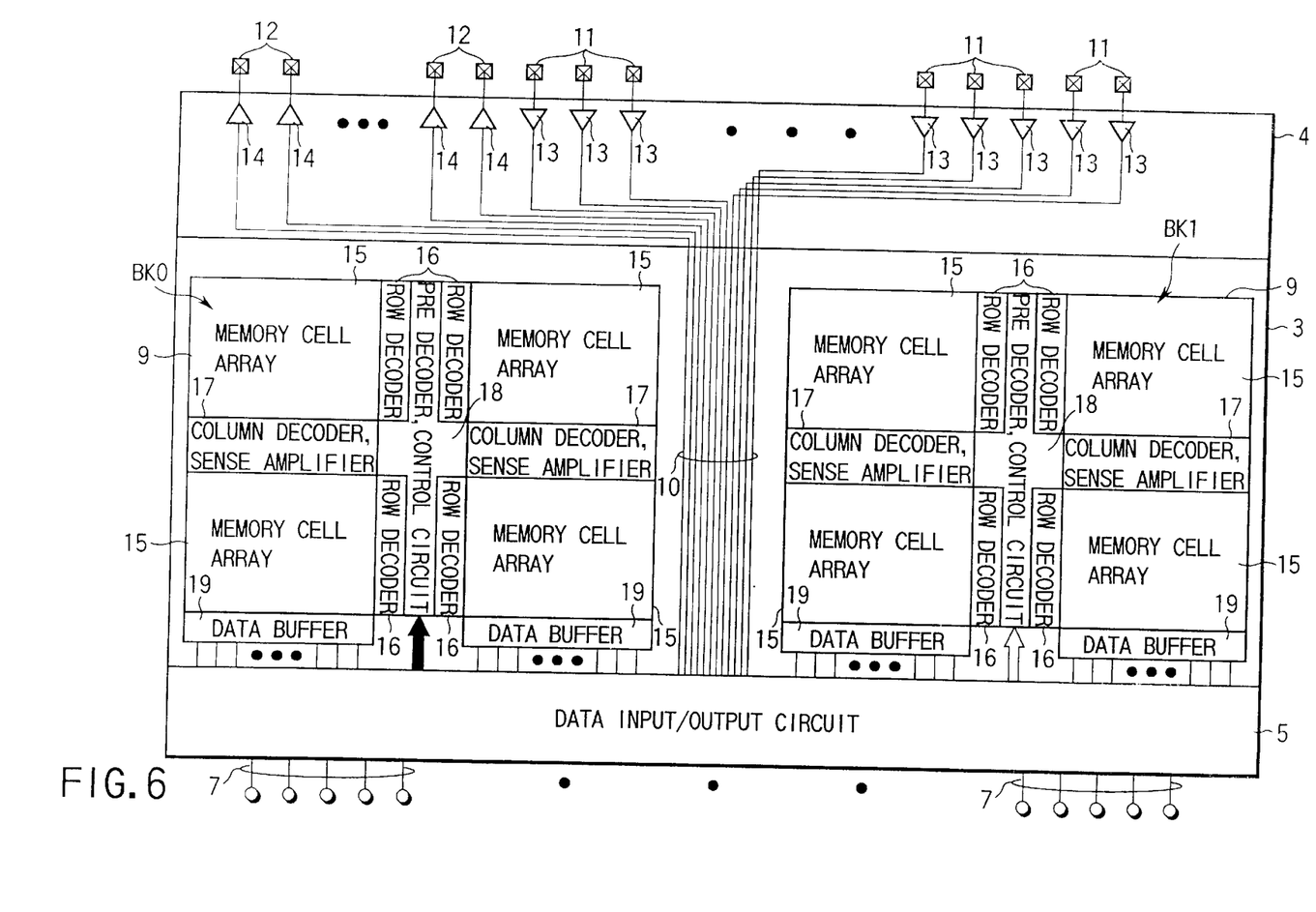
FIG. 6 is a diagram showing an example of the test control circuit shown in FIGS. 2 and 5.

FIG. 6 shows an example of the structure of the test control circuit 4 shown in FIGS. 2 and 5 and a layout of a memory core 9.

The test control circuit 4 comprises data input pads 11, data output pads 12, data input buffers 13 and data output buffers 14.

Test data is applied to a data input pad 11, and guided to the data input/output circuit 5 through the data bus 10. In the memory core 9, the test data is written in and read from a memory cell array 15 in the test mode. The read data or a test result is output through a data output pad 12 through the data bus 10.

In the layout of this embodiment, the memory macro section has two memory cores 9, corresponding to blocks BK0 and BK1. Since the test control circuit 4 is arranged along one side of the memory macro section 3 and the data input/output circuit 5 is arranged along the side opposite to that along which the test control circuit 4 is arranged, the data bus 10 is arranged between the two blocks BK0 and BK1, so that the test control circuit 4 and the data input/output circuit 5 are connected to each other.

The data input/output circuit 5 basically transmits data between the logic section 1 and the memory macro section 3. In order to supply or output data to or from the data input/output circuit 5, the data input/output circuit 5 comprises flip-flop circuits, each having two input or output terminals.

Each of the blocks BK0 and BK1 comprises memory cell arrays 15, row decoders 16, column decoder/sense amplifier sections 17, a predecoder/control circuit 18 and data buffers 19. Each of the block BK0 and BK1 has four memory cell arrays 15.

Figure 7:
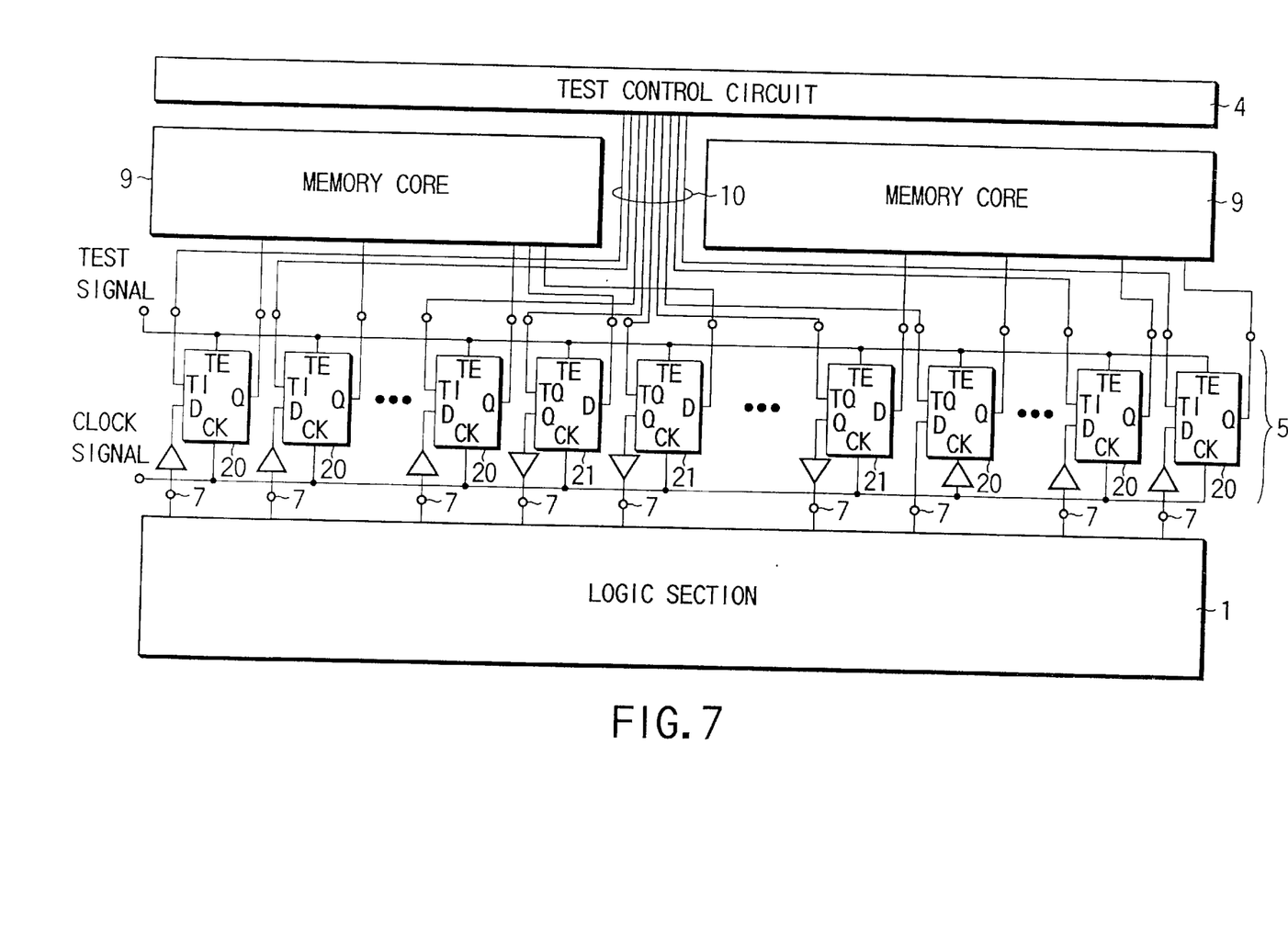
FIG. 7 is a diagram showing an example of the data input/output circuit shown in FIGS. 2 and 5.

FIG. 7 shows an example of the data input/output circuit 5 shown in FIGS. 2 and 5.

The data input/output circuit 5 comprises flip-flop circuits 20, each having two input terminals and one output terminal and flip-flop circuits 21, each having one input terminal and two output terminals.

The flip-flop 20 operates in synchronism with a clock signal CK. Data D from the logic section 1 and test input data T1 from the test control circuit 4 are input to the flip-flop circuit 20.

When a test enable signal TE is in an enable state (test mode), test input data is output from the output terminal Q of the flip-flop circuit 20 and supplied to the memory core 9. When the test enable signal TE is in a disable state (normal operation mode), data supplied from the logic section 1 is output from the output terminal Q of the flip-flop circuit 20 and supplied to the memory core 9.

In the same manner, the flip-flop circuit 21 operates in synchronism with a clock signal CK. Data D from the memory core 9 is input to the flip-flop circuit 21.

When the test enable signal TE is in the enable state (test mode), read data supplied from the memory core 9 is output from an output terminal TQ of the flip-flop circuit 21 and guided to the test control circuit 4. When the test enable signal TE is in the disable state (normal operation mode), read data supplied from the memory core 9 is output from an output terminal Q of the flip-flop circuit 21 and supplied to the logic section 1.

The structure described above allows a test of the memory core 9 in the test mode and data transmission between the logic section 1 and the memory core 9 in the normal operation mode.

Figure 8:
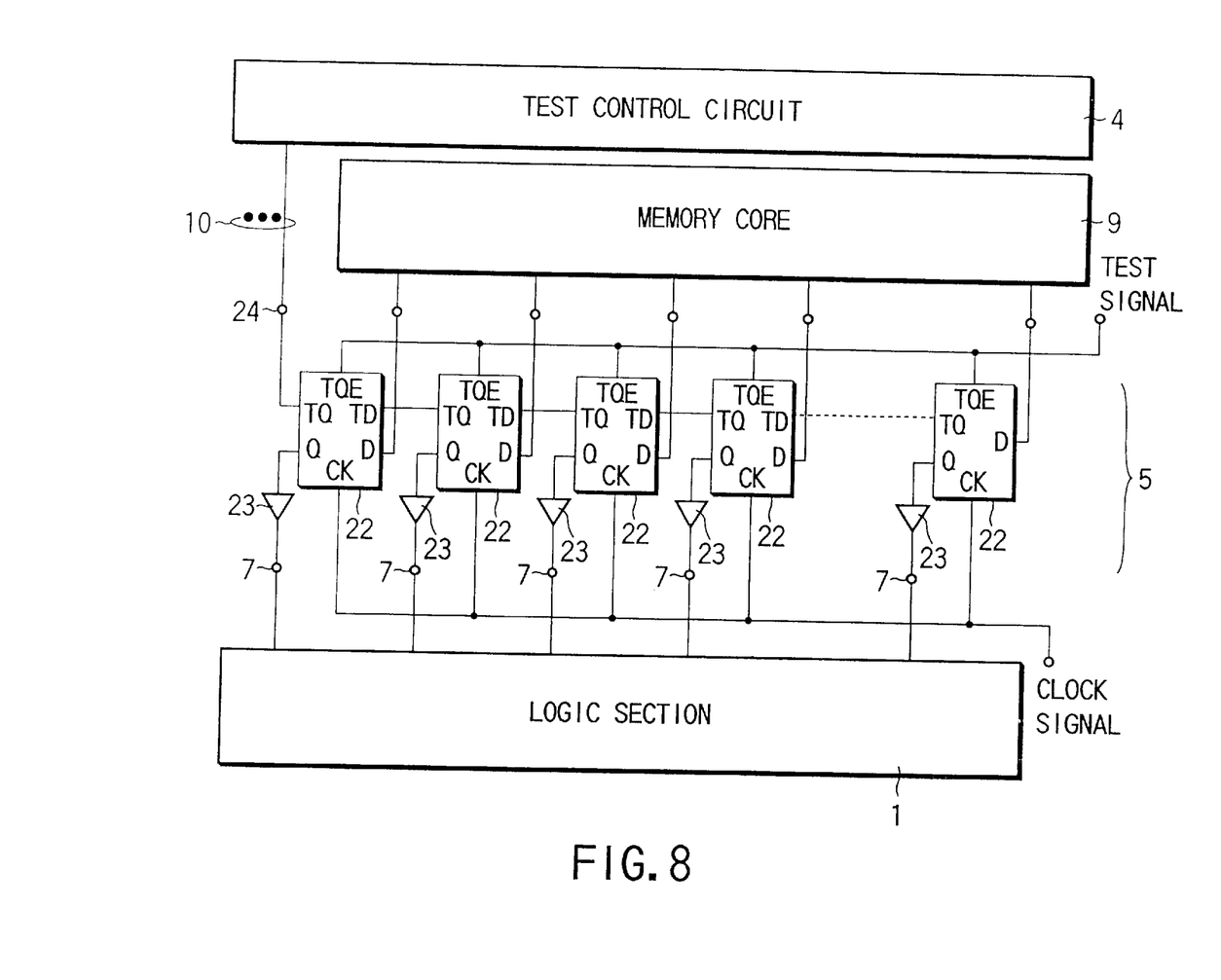
FIG. 8 is a diagram showing another example of the data input/output circuit shown in FIGS. 2 and 5.

FIG. 8 shows another example of the data input/output circuit 5 shown in FIGS. 2 and 5.

In this example, the data input/output circuit 5 comprises flip-flop circuits 22, each having two input terminals and two output terminals, instead of the flip-flop circuits 21 of the example shown in FIG. 7.

The flip-flop circuit 22 operates in synchronism with the clock signal CK. Data D from the memory core 9 is input to the flip-flop circuit 22. The flip-flop circuits 22 are connected in series, so that data from a preceding flip-flop circuit 22 can be input to a subsequent flip-flop circuit 22.

When a test enable signal TQE is in the enable state (test mode), read data supplied from the memory core 9 is output from an output terminal TQ of the flip-flop circuit 22, transferred to a shift register and guided to the test control circuit 4 via an output terminal pattern 24.

When a test enable signal TQE is in the disable state (normal operation mode), read data supplied from the memory core 9 is output from an output terminal Q of the flip-flop circuit 22 and supplied to the logic section 1 via a buffer 23.

This structure allows a test of the memory core 9 in the test mode and data transmission between the logic section 1 and the memory core 9 in the normal operation mode. In addition, according to the layout of this example, the number of wires (of the data bus 10) used to output read data can be reduced, thereby reducing the wiring area and the area of the chip.

Figure 9:
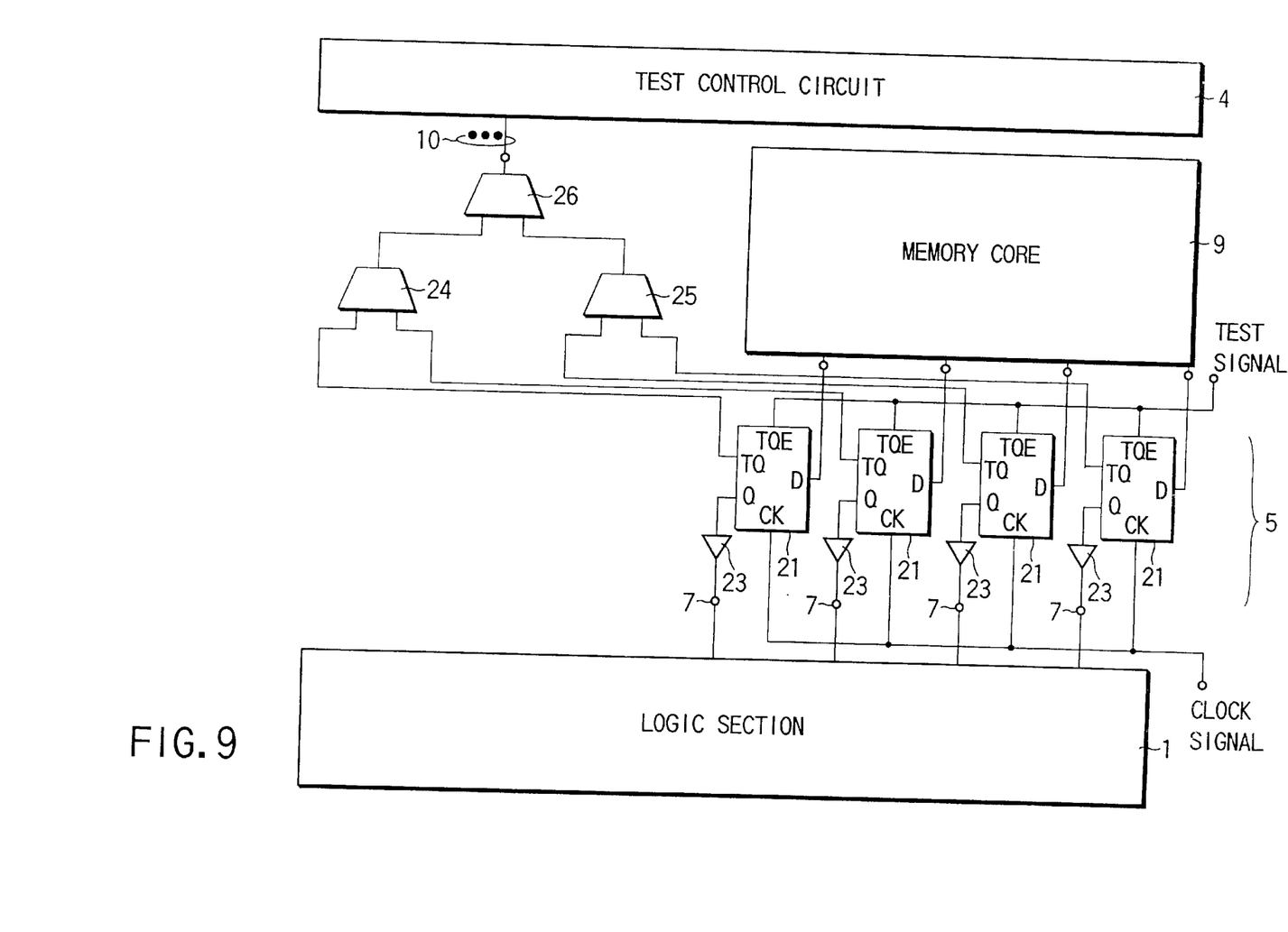
FIG. 9 is a diagram showing still another example of the data input/output circuit shown in FIGS. 2 and 5.

FIG. 9 shows still another example of the data input/output circuit 5 shown in FIGS. 2 and 5.

In this example, the output terminals TQ of the flip-flop circuits 21 shown in FIG. 7 are connected to multiplexers 24 to 26, in order to reduce the number of wires of the data bus 10.

The flip-flop circuit 21 operates in synchronism with the clock signal CK. Data D from the memory core 9 is input to the flip-flop circuit 21.

When a test enable signal TQE is in the enable state (test mode), read data supplied from the memory core 9 are output from an output terminal TQ of the flip-flop circuit 21, and successively guided to the test control circuit 4 by the multiplexers 24 to 26.

When the test enable signal TQE is in the disable state (normal operation mode), read data from the memory core 9 is output from an output terminal Q of the flip-flop circuit 22 and supplied to the logic section 1 via a buffer 23.

With this structure also, the number of wires (of the data bus 10) used to output read data can be reduced, thereby reducing the wiring area and the area of the chip.

Figure 10:
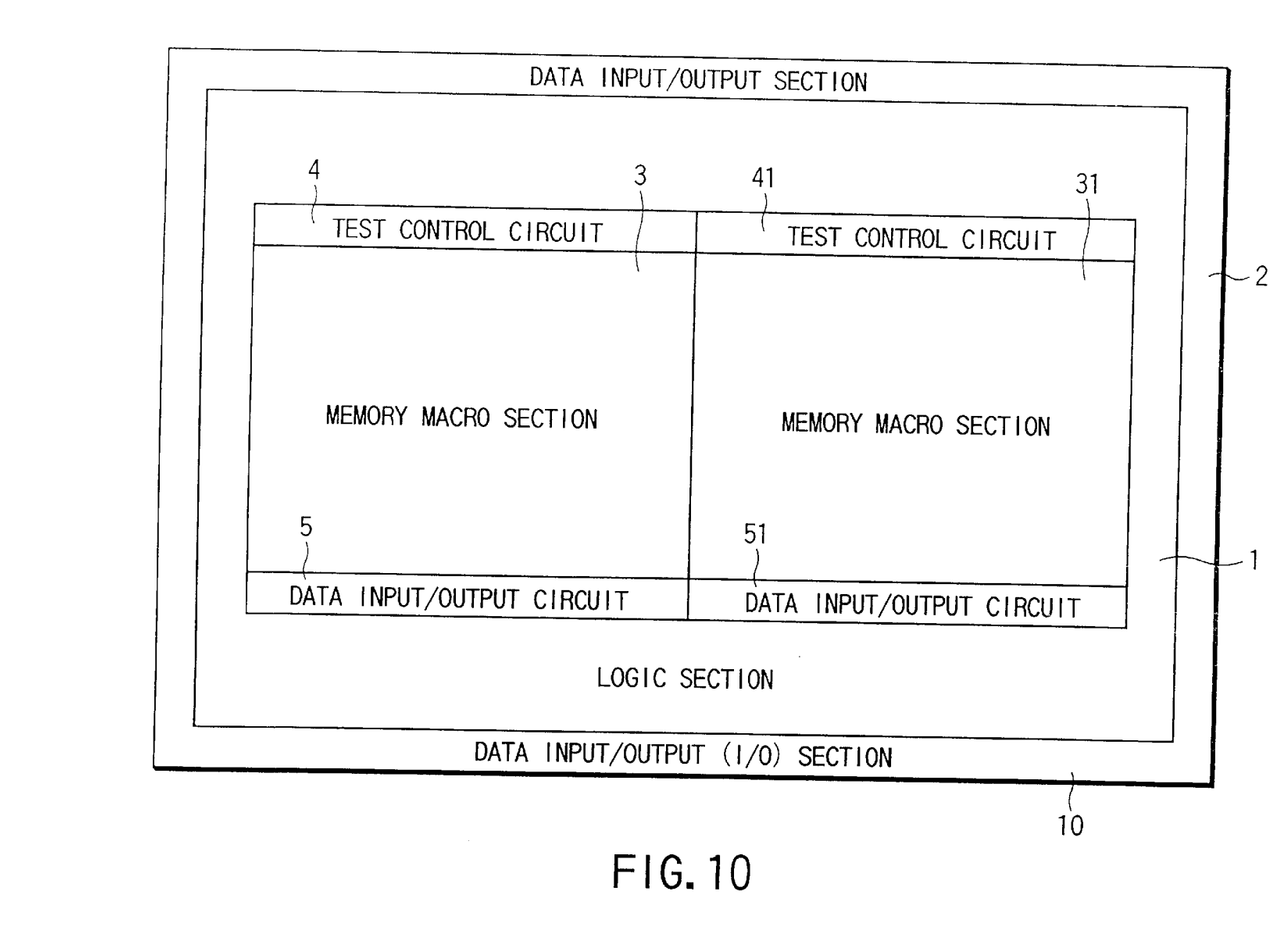
FIG. 10 is a diagram showing a chip layout according to a third embodiment of the present invention.

FIG. 10 shows a chip layout of the memory-logic LSI according to a third embodiment of the present invention.

A logic section 1, a data input/output section 2, and memory macro sections 3 and 31 are formed on the main surface of the LSI chip 10. The LSI of this embodiment is different in chip layout from the LSI shown in FIG. 2 in that the chip comprises two memory macro sections.

The memory macro sections 3 and 31 are formed in a central portion of the LSI chip 10 on the main surface thereof. The memory macro sections 3 and 31 respectively comprise test control circuits 4 and 41 and data input/output circuits 5 and 51.

The test control circuit 4 is arranged along a part of the periphery of the memory macro section 3. The data input/output circuit 5 is arranged along another part of the periphery of the memory macro section 3.

For example, if the memory macro section 3 is a rectangular section arranged on the LSI chip 10, the test control circuit 4 is arranged along one side of the memory macro section 3 and the data input/output circuit 5 is arranged along another side of the memory macro section 3 (e.g., the side opposite to that along which the test control circuit 4 is arranged).

Similarly, the test control circuit 41 is arranged along a part of the periphery of the memory macro section 3. The data input/output circuit 51 is arranged along another part of the periphery of the memory macro section 3.

For example, if the memory macro section 31 is a rectangular section arranged on the LSI chip 10, the test control circuit 41 is arranged along one side of the memory macro section 31 and the data input/output circuit 51 is arranged along another side of the memory macro section 31 (e.g., the side opposite to that along which the test control circuit 41 is arranged).

The test control circuits 4 and 41 are used to test the memory macro sections 3 and 31 in a test mode. The data input/output circuits 5 and 51 are used to transmit data between the logic section 1 and the memory macro sections 3 and 31 in a normal operation mode.

The logic section 1 surrounds the memory macro sections 3 and 31. The logic section 1 comprises a gate array, a standard cell and a mega-cell, etc.

The data input/output section 2, arranged along the periphery of the LSI chip 10, is used to transmit data between the interior of the LSI chip and an external device. The data input/output section 2 comprises data input/output circuits, data input/output pads and protecting circuits.

A first feature of the chip layout of the above memory-logic LSI according to the third embodiment is that the test control circuits 4 and 41 are arranged within the memory macro sections 3 and 31 formed as a module, like the layout shown in FIG. 2. Since the layout of the test control circuits 4 and 41 is not influenced by the layout of the logic section 1, even if the structure of the logic section 1 is changed, it is unnecessary to redesign the test control circuits 4 and 41.

A second feature of the layout of this embodiment is that a common test data input circuit is used for both the test control circuits 4 and 41 (to be described later in detail).

Figure 11:
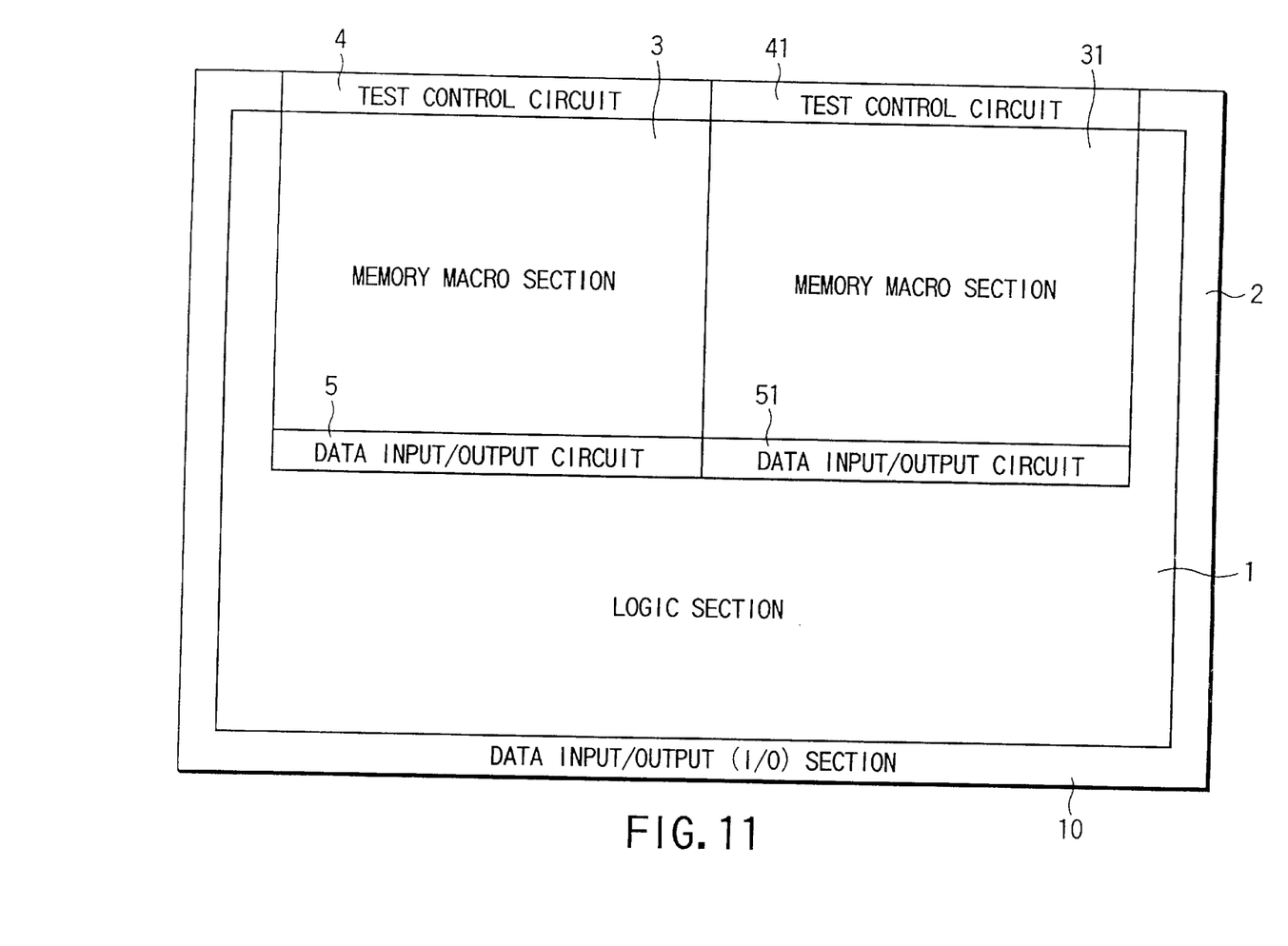
FIG. 11 is a diagram showing a chip layout according to a fourth embodiment of the present invention.

FIG. 11 shows a chip layout according to a fourth embodiment of the present invention.

A logic section 1, a data input/output section 2, and memory macro sections 3 and 31 are formed on the main surface of the LSI chip 10. The LSI of this embodiment is different in chip layout from the LSI shown in FIG. 5 in that the chip comprises two memory macro sections.

The memory macro sections 3 and 31 are adjacent to one side of the LSI chip 10 on the main surface thereof. The memory macro sections 3 and 31 respectively comprise test control circuits 4 and 41 and data input/output circuits 5 and 51.

The test control circuit 4 is arranged along a part of the periphery of the memory macro section 3, which coincides with a part of said side of the LSI chip 10. The data input/output circuit 5 is arranged along another part of the periphery of the memory macro section 3.

For example, if the memory macro section 3 is a rectangular section arranged on the LSI chip 10, the test control circuit 4 is arranged along one side of the memory macro section 3 (which coincides with one side of the LSI chip 10) and the data input/output circuit 5 is arranged along another side of the memory macro section 3 (e.g., the side opposite to that along which the test control circuit 4 is arranged).

Similarly, the test control circuit 41 is arranged along a part of the periphery of the memory macro section 31, which coincides with a part of said side of the LSI chip 10. The data input/output circuit 51 is also arranged along a part of the periphery of the memory macro section 31.

For example, if the memory macro section 31 is a rectangular section arranged on the LSI chip 10, the test control circuit 41 is arranged along one side of the memory macro section 31 (which coincides with one side of the LSI chip 10) and the data input/output circuit 51 is arranged along another side of the memory macro section 31 (e.g., the side opposite to that along which the test control circuit 41 is arranged).

The test control circuits 4 and 41 are used to test the memory macro sections 3 and 31 in a test mode. The data input/output circuits 5 and 51 are used to transmit data between the logic section 1 and the memory macro sections 3 and 31 in a normal operation mode.

The logic section 1 surrounds two sides of each of the memory macro sections 3 and 31, except the sides along which the test control circuits 4 and 41 are arranged and the side along which the memory macro sections 3 and 31 contact with each other. The logic section 1 comprises a gate array, a standard cell and a mega-cell, etc.

The data input/output section 2 is arranged along the three sides of the LSI chip 10, except the side along which the test control circuits 4 and 41 are arranged. The section 2 is used to transmit data between the interior of the LSI chip and an external device, and comprises data input/output circuits, data input/output pads and protecting circuits.

According to the chip layout of the aforementioned memory-logic LSI also, the test control circuits 4 and 41 are arranged within the memory macro sections 3 and 31. In other words, since the layout of the test control circuits 4 and 41 is not influenced by the layout of the logic section 1, even if the structure of the logic section 1 is changed, it is unnecessary to redesign the test control circuits 4 and 41. Therefore, the load of the LSI designer is lightened. In addition, the LSI of the present invention, formed as an ASIC, achieves reduction of a developing period and standardization of tests.

Further, with the layout of this embodiment, a common test data input circuit is used for both the test control circuits 4 and 41. Thus, the size of the test control circuits 4 and 41 is reduced, resulting in reduction in the area of the chip.

Figure 12:
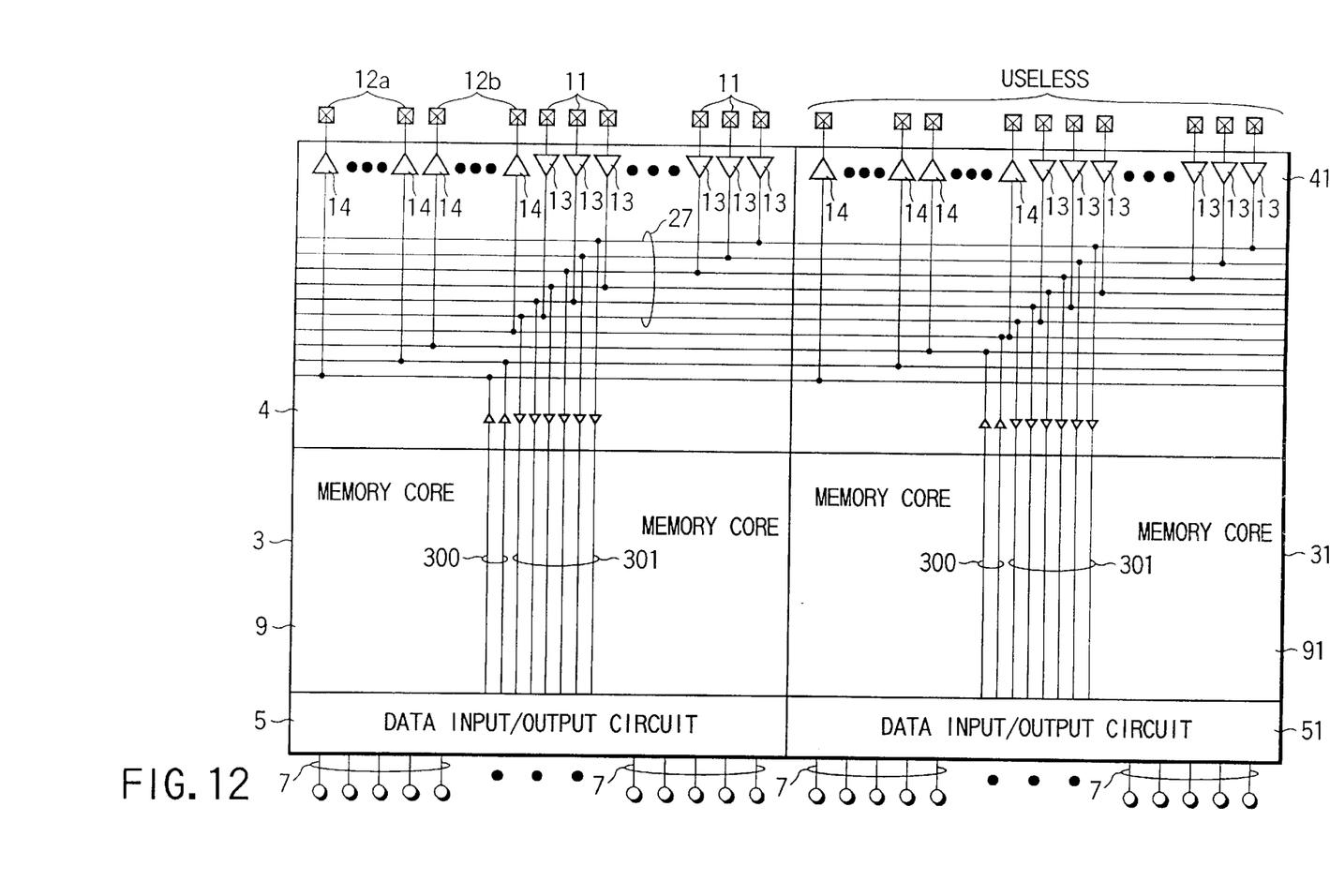
FIG. 12 is a diagram showing an example of the test control circuits shown in FIGS. 10 and 11.

FIG. 12 shows an example of the structure of the test control circuits 4 and 41 shown in FIGS. 10 and 11.

The test control circuit 4 comprises data input pads 11, data output pads 12a and 12b, data input buffers 13 and data output buffers 14. The test control circuit 41 also comprises data input pads, data output pads, data input buffers and data output buffers (the layouts of the test control circuits 4 and 41 are the same). However, these pads and buffers of the test control circuit 41 are not used.

In other words, one test data input circuit is used for both the test control circuits 4 and 41. More specifically, the test control circuits 4 and 41 have a common test data line 27, so that test data is supplied to the data input/output circuits 5 and 51 through the test data line 27.

Since the memory macro sections 3 and 31 must be evaluated individually, an output signal cannot be used in common. For this reason, the test control circuit 4 has the data output pads 12a for the memory macro section 3 and the data output pads 12b for the memory macro section 31.

Test data is applied to, for example, a data input pad 11 in the memory macro section 3, and guided to the data input/output circuits 5 and 51 through a data bus 301. In memory cores 9 and 91, test data is written in and read from memory cell arrays in the test mode.

Data read from a memory cell array in the memory core 9 is output from the data output pad 12a via the data input/output circuit 5 and a data bus 300. Data read from a memory cell array in the memory core 91 is output from the data output pad 12b via the data input/output circuit 51 and the data bus 300.

The layout within the memory cores 9 and 91 can be the same as that of the memory core 9 shown in FIG. 6.

As described above, the memory-logic LSI of the present invention has the following advantages.

In the memory-logic LSI, since the test control circuit for testing the memory macro section is arranged within the memory macro section, the layout of the test control circuit is not influenced by the layout of the logic section. Therefore, even if the structure of the logic section is changed, it is unnecessary to rearrange the test control circuit.

The test control circuit and the data input/output circuit area are arranged opposite to each other within the memory macro section. If test result data is serially supplied to the test control circuit, the wiring region in the memory macro section can be small.

In addition, if one test data input circuit is used for both the two test control circuits, the size of the test control circuits is reduced and the wiring region in the memory macro section can be small, resulting in reduction in the area of the chip.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

We claim:

1. A one-chip LSI having a chip on which a memory and a logic are formed, comprising:

a memory macro section arranged on a main surface of the chip and including the memory;

a logic section arranged on the main surface of the chip and including the logic; and a data input/output section, arranged on the main surface of the chip, for transmitting data between an interior of the chip and an external device, the memory macro section including: a data input/output circuit, arranged along a part of a periphery of the memory macro section, for transmitting data between the memory macro section and the logic section; and a test control circuit, arranged along another part of the periphery of the memory macro section, for controlling test of the memory macro section, the data input/output circuit and the test control circuit being opposed to each other.

2. The one-chip LSI according to claim 1, wherein the memory macro section is arranged in a central portion of the chip, the logic section surrounds the memory macro section, and the data input/output section is arranged along a periphery of the chip.

3. The one-chip LSI according to claim 1, wherein the memory macro section is a rectangular section formed on the main surface of the chip, the data input/output circuit is arranged along a first side of the memory macro section, and the test control circuit is arranged along a second side of the memory macro section.

4. The one-chip LSI according to claim 1, wherein the memory macro section and the logic section are connected to each other through a data input/output terminal pattern.

5. The one-chip LSI according to claim 1, wherein the memory is of a multiple-bit type which allows data of a plurality of bits to be simultaneously input and output.

6. The one-chip LSI according to claim 1, wherein the data input/output circuit of the memory macro section and the test control circuit of the memory macro section do not touch each other.

7. The one-chip LSI according to claim 1, wherein the part of the periphery of the memory macro section, along which the test control circuit is arranged, coincides with a part of a periphery of the LSI chip.

8. The one-chip LSI according to claim 7, wherein the memory macro section is a rectangular section formed on the main surface of the chip, the data input/output circuit is arranged along a first side of the memory macro section, and the test control circuit is arranged along a second side of the memory macro section.

9. The one-chip LSI according to claim 1, wherein the test control circuit and the data input/output circuit are connected to each other through a data bus, test data is supplied from the test control circuit to the data input/output circuit through the data bus, and read data for discriminating a test result is supplied from the data input/output circuit to the test control circuit through the data bus.

10. The one-chip LSI according to claim 9, wherein the data input/output circuit comprises a plurality of flip-flop circuits, each having two input terminals and one output terminal, and the plurality of flip-flop circuits guide the test data supplied from the test control circuit or data supplied from the logic section to based on a test signal.

11. The one-chip LSI according to claim 9, wherein the data input/output circuit comprises a plurality of flip-flop circuits, each having two input terminals and two output terminals, the plurality of flip-flop circuits guide data read from the memory macro section to the test control circuit or the logic section based on a test signal, and when the plurality of flip-flop circuits guide the data read from the memory macro section to the test control circuit, the data are transferred by a shift register and successively guided to the test control circuit.

12. The one-chip LSI according to claim 9, wherein the data input/output circuit comprises a plurality of flip-flop circuits, each having one input terminal and two output terminals, and the plurality of flip-flop circuits guide data read from the memory macro section to the test control circuit or the logic section based on a test signal.

13. The one-chip LSI according to claim 12, further comprising a multiplexer for multiplexing the data read from the memory macro section and guiding the multiplexed data to the test control circuit.

14. A one-chip LSI having a chip on which memories and a logic are formed, comprising:

a plurality of memory macro sections arranged on a main surface of the chip and including the memories;

a logic section arranged on the main surface of the chip and including the logic; and a data input/output section, arranged on the main surface of the chip, for transmitting data between an interior of the chip and an external device, each of the memory macro sections including: a data input/output circuit, arranged along a part of a periphery of the memory macro section, for transmitting data between the memory macro section and the logic section; and a test control circuit, arranged along another part of the periphery of the memory macro section, for controlling test of the memory macro section, the test control circuit of each of the memory macro sections including a test data line common to the plurality of memory macro sections, and test data being supplied to the data input/output circuits of the plurality of memory macro sections through the test data line.

15. The one-chip LSI according to claim 14, wherein the plurality of the memory macro sections have a same layout.

16. The one-chip LSI according to claim 14, wherein data read from the plurality of memory macro sections are output from the chip via respective data output pads of the plurality of memory macro sections.

17. The one-chip LSI according to claim 14, wherein each of the data input/output circuits of each of the memory macro sections do not touch any of the test control circuits of the plurality of memory macro sections.

18. A one-chip LSI having a chip on which a memory and a logic are formed, comprising:

a memory macro section arranged on a main surface of the chip and including the memory;

a logic section arranged on the main surface of the chip and including the logic; and a data input/output section, arranged on the main surface of the chip, for transmitting data between an interior of the chip and an external device, the memory macro section including: a data input/output circuit, arranged along a part of a periphery of the memory macro section, for transmitting data between the memory macro section and the logic section; and a test control circuit, arranged along another part of the periphery of the memory macro section, for controlling test of the memory macro section, the memory macro section being a rectangular section formed on the main surface of the chip, the data input/output circuit being arranged along a first side of the memory macro section, the test control circuit being arranged along a second side of the memory macro section.

19. A one-chip LSI having a chip on which a memory and a logic are formed, comprising:

a memory macro section arranged on a main surface of the chip and including the memory;

a logic section arranged on the main surface of the chip and including the logic; and a data input/output section, arranged on the main surface of the chip, for transmitting data between an interior of the chip and an external device, the memory macro section including: a data input/output circuit, arranged along a part of a periphery of the memory macro section, for transmitting data between the memory macro section and the logic section; and a test control circuit, arranged along another part of the periphery of the memory macro section, for controlling test of the memory macro section, the part of the periphery of the memory macro section, along which the test control circuit is arranged, coinciding with a part of a periphery of the LSI chip.

20. A one-chip LSI having a chip on which a memory and a logic are formed, comprising:

a memory macro section arranged on a main surface of the chip and including the memory;

a logic section arranged on the main surface of the chip and including the logic; and a data input/output section, arranged on the main surface of the chip, for transmitting data between an interior of the chip and an external device, the memory macro section including: a data input/output circuit, arranged along a part of a periphery of the memory macro section, for transmitting data between the memory macro section and the logic section; and a test control circuit, arranged along another part of the periphery of the memory macro section, for controlling test of the memory macro section, the memory being a multiple-bit type which allows data of a plurality of bits to be simultaneously input and output.

21. A one-chip LSI having a chip on which a memory and a logic are formed, comprising:

a memory macro section arranged on a main surface of the chip and including the memory;

a logic section arranged on the main surface of the chip and including the logic;

a data input/output section, arranged on the main surface of the chip, for transmitting data between an interior of the chip and an external device; and a data bus for transferring test data from the test control circuit to the data input/output circuit and for transferring read data for discriminating a test result from the data input/output circuit to the test control circuit, the memory macro section including: a data input/output circuit, arranged along a part of a periphery of the memory macro section, for transmitting data between the memory macro section and the logic section; and a test control circuit, arranged along another part of the periphery of the memory macro section, for controlling test of the memory macro section.

22. A one-chip LSI having a chip on which memories and a logic are formed, comprising:

a plurality of memory macro sections arranged on a main surface of the chip and including the memories;

a logic section arranged on the main surface of the chip and including the logic; and a data input/output section, arranged on the main surface of the chip, for transmitting data between an interior of the chip and an external device, each of the memory macro sections including: a data input/output circuit, arranged along a part of a periphery of the memory macro section, for transmitting data between the memory macro section and the logic section; and a test control circuit, arranged along another part of the periphery of the memory macro section, for controlling test of the memory macro section, the data input/output circuit and the test control circuit of each memory macro section being opposed to each other, the test control circuit of each of the memory macro sections including a test data line common to the plurality of memory macro sections, and test data being supplied to the data input/output circuits of the plurality of memory macro sections through the test data line.

23. The one-chip LSI according to claim 22, wherein the plurality of the memory macro sections have a same layout.

24. The one-chip LSI according to claim 22, wherein data read from the plurality of memory macro sections are output from the chip via respective data output pads of the plurality of memory macro sections.

25. A one-chip LSI comprising:

a chip;

a logic section arranged on a main surface of the chip and including a logic;

a data input/output section, arranged on the main surface of the chip, for transferring data to and from the chip; and a plurality of memory macro sections arranged on the main surface of the chip and including memory, each of the plurality of memory macro sections including:
   a data input/output circuit, arranged along a first portion of a periphery of the respective memory macro section, for transmitting data between the respective memory macro section and the logic section; and
   a test control circuit, arranged along a second portion different from the first portion of the periphery of the respective memory macro section, for controlling test of the memory macro section.

26. The one-chip LSI according to claim 25, wherein the data input/output circuit and the test control circuit of each memory macro section are opposed to each other.

* * * * *